US010845010B2

(12) United States Patent
Matsushima et al.

(10) Patent No.: US 10,845,010 B2
(45) Date of Patent: Nov. 24, 2020

(54) LIGHT SOURCE DEVICE

(71) Applicant: USHIO DENKI KABUSHIKI KAISHA, Tokyo (JP)

(72) Inventors: Takeo Matsushima, Tokyo (JP); Yasushi Omae, Tokyo (JP); Motonori Tada, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 13 days.

(21) Appl. No.: 16/070,967

(22) PCT Filed: Jan. 17, 2017

(86) PCT No.: PCT/JP2017/001405
§ 371 (c)(1),
(2) Date: Jul. 18, 2018

(87) PCT Pub. No.: WO2017/126500
PCT Pub. Date: Jul. 27, 2017

(65) Prior Publication Data
US 2019/0032869 A1 Jan. 31, 2019

(30) Foreign Application Priority Data

Jan. 20, 2016 (JP) .................. 2016-009241

(51) Int. Cl.
*F21S 2/00* (2016.01)
*F21V 17/04* (2006.01)
(Continued)

(52) U.S. Cl.
CPC ............... *F21S 2/005* (2013.01); *F21K 9/20* (2016.08); *F21V 17/04* (2013.01); *F21V 19/02* (2013.01);
(Continued)

(58) Field of Classification Search
CPC .... F21S 2/005; G03F 7/70141; G03F 7/7005; G03F 7/2008; G03F 7/201; G03F 7/20;
(Continued)

(56) References Cited

U.S. PATENT DOCUMENTS 4,918,583 A    4/1990  Kudo et al.
2005/0157263 A1  7/2005  Sakata et al.
(Continued)

FOREIGN PATENT DOCUMENTS

JP    H02-048627 A    2/1990
JP    2003-015314 A   1/2003
(Continued)

OTHER PUBLICATIONS

International Search Report issued in PCT/JP2017/001405; dated Apr. 18, 2017.
(Continued)

*Primary Examiner* — Isiaka O Akanbi
*Assistant Examiner* — Glenn D Zimmerman
(74) *Attorney, Agent, or Firm* — Studebaker & Brackett PC

(57) ABSTRACT

The light source device of the present invention has a light source unit having a plurality of LED elements; a first optical system that collimates each of light emitted from the light source unit; and a second optical system that collects a plurality of light emitted from the first optical system. At least one of the light source unit and the first optical system is provided with an adjustment mechanism for adjusting a positional relationship between the light source unit and the first optical system relative to each other.

13 Claims, 10 Drawing Sheets

(51) Int. Cl.
  *F21V 19/02* (2006.01)
  *G03F 7/20* (2006.01)
  *F21K 9/20* (2016.01)
  *F21V 17/02* (2006.01)
  *F21Y 115/10* (2016.01)

(52) U.S. Cl.
  CPC .............. *G03F 7/20* (2013.01); *G03F 7/201* (2013.01); *G03F 7/2008* (2013.01); *G03F 7/7005* (2013.01); *G03F 7/70141* (2013.01); *F21V 17/02* (2013.01); *F21Y 2115/10* (2016.08)

(58) Field of Classification Search
  CPC ...... G03F 7/70391; G03F 7/2002; F21K 9/20; F21K 2/00; F21V 19/02; F21V 17/04; F21V 17/02; F21Y 2115/10
  See application file for complete search history.

(56) References Cited

U.S. PATENT DOCUMENTS

| | | | |
|---|---|---|---|
| 2005/0174775 A1* | 8/2005 | Conner | G02B 27/0994 362/268 |
| 2014/0017603 A1* | 1/2014 | Mori | G03F 7/706 430/5 |
| 2014/0139810 A1* | 5/2014 | Matsubara | G03B 21/2013 353/31 |
| 2015/0217132 A1* | 8/2015 | Makkapati | A61N 5/0621 607/90 |
| 2016/0223894 A1* | 8/2016 | Yamada | G02B 27/48 |
| 2017/0052384 A1* | 2/2017 | Santori | G01N 21/05 |
| 2018/0132330 A1* | 5/2018 | Chong | F21S 41/153 |

FOREIGN PATENT DOCUMENTS

| | | |
|---|---|---|
| JP | 2004-253758 A | 9/2004 |
| JP | 2004-335953 A | 11/2004 |
| JP | 2005157059 A | 6/2005 |
| JP | 2007-059510 A | 3/2007 |
| JP | 2007212496 A | 8/2007 |
| JP | 2014-003086 A | 1/2014 |
| KR | 100688673 B1 | 3/2007 |
| WO | 2013187299 A1 | 12/2013 |
| WO | WO-2015122346 A1 * | 8/2015 |

OTHER PUBLICATIONS

Translation of the International Preliminary Report on Patentability issued in corresponding International Application No. PCT/JP2017/001405; dated Aug. 2, 2018.
An Office Action issued by the State Intellectual Property Office of the People's Republic of China dated Oct. 8, 2019, which corresponds to Chinese Patent Application No. 201780004568.2 and is related to U.S. Appl. No. 16/070,967. with English language translation.
An Office Action mailed by the Korean Patent Office dated Jun. 18, 2019, which corresponds to Korean Patent Application 10-2018-7020732 and is related to U.S. Appl. No. 16/070,967.
An Office Action mailed by the Japanese Patent Office dated Nov. 13, 2019, which corresponds to Japanese Patent Application No. 2016-009241 and is related to U.S. Appl. No. 16/070,967.
An Office Action; "Notice of Reasons for Refusal," issued by the Japanese Patent Office dated Apr. 24, 2020, which corresponds to Japanese Patent Application No. 2016-009241 and is related to U.S. Appl. No. 16/070,967 with English language translation.
An Office Action; "Decision of Dismissal of Amendment", mailed by the Japanese Patent Office dated Oct. 16, 2020, which corresponds to Japanese Patent Application No. 2016-009241 and is related to U.S. Appl. No. 16/070,967; with English language translation.
An Office Action; "Decision of Refusal", mailed by the Japanese Patent Office dated Oct. 16, 2020, which corresponds to Japanese Patent Application No. 2016-009241 and is related to U.S. Appl. No. 16/070,967; with English language translation.

* cited by examiner

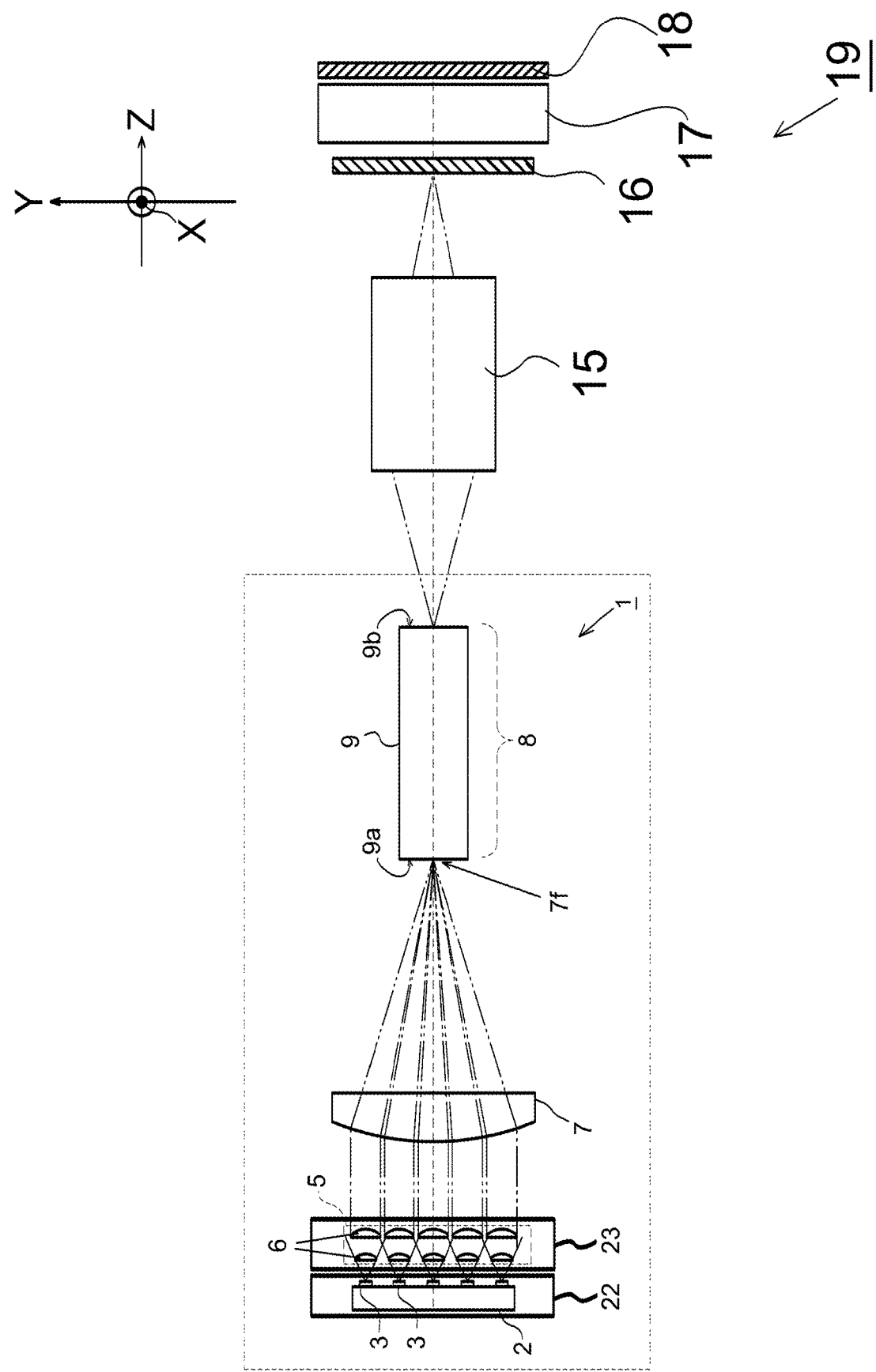

LIGHT SOURCE DEVICE

TECHNICAL FIELD

The present invention relates to a light source device, and more particularly to a light source device including a plurality of LED elements.

BACKGROUND ART

Optical processing techniques that utilize light are conventionally used in a number of different fields. Exposure devices, for example, have found application in microfabrication that uses light. Exposure technology has been developed in various fields in recent years and utilized for microfabrication of relatively large patterns and three-dimensional structures, among others. More specifically, exposure technology is used, for example, for the fabrication of LED electrode patterns, and in production processes of MEMS (Micro Electro Mechanical Systems) typified by acceleration sensors.

High-brightness discharge lamps have been used conventionally as the light source in these optical processing techniques. With the progress of solid light source techniques in recent years, the applicability of a multiple LED elements configuration as a light source is being investigated. As one such technique, Patent Document 1, for example, discloses an exposure device having a multiple LED elements unit as a light source and a fly eye lens disposed between this light source and a mask.

PRIOR ART DOCUMENT

Patent Document

Patent Document 1: JP-A-2004-335953

SUMMARY OF THE INVENTION

Problems to be Solved by the Invention

The light source configured with LED elements produces less radiant flux as compared to a light source device in which the light source is configured with a lamp. To construct a light source device that achieves a high light output, it is necessary to collect light beams emitted from the plurality of LED elements as much as possible. In collecting light, if there is any misalignment between the plurality of LED elements and a downstream optical system, the target optical system where the light is to be used cannot be supplied with a sufficient amount of light. Such a misalignment inevitably occurs to some extent or other.

In view of the problem described above, an object of the present invention is to provide a light source device including a plurality of LED elements, the light source device being capable of minimizing a decrease in illuminance accompanied by a misalignment.

Means for Solving the Problem

A light source device of the present invention has:
a light source unit having a plurality of LED elements;
a first optical system that collimates each of light emitted from the light source unit; and
a second optical system that collects a plurality of light emitted from the first optical system, wherein at least one of the light source unit and the first optical system is provided with an adjustment mechanism for adjusting a positional relationship between the light source unit and the first optical system relative to each other.

As mentioned above, the light emitted from one LED element has lower brightness than that of a lamp. Therefore, for expected use as a light source in applications that require a large amount of light such as an exposure device, it is important to collect light from a large number of LED elements while keeping the brightness as much as possible.

According to the configuration described above, the light emitted from the plurality of LED elements is collected after being collimated in the first optical system. Thus an image can be formed at the focal point by the light beams emitted from each LED element. The distance between the light beams emitted from each LED element can be made shorter by adjusting the arrangement of the collimate lenses (first optical system) so that the light source is configured to have a smaller non-light-emitting region. Thus a high-brightness light source device is realized.

Should there be a misalignment between the light source unit and the first optical system in such a configuration, it is expected that the amount of light guided to components downstream of the second optical system is reduced. More specifically, if the positions of each LED element and the corresponding collimate lenses (first optical system) are misaligned individual to each other, the focal point of the second optical system will be out of position, in which case the light can hardly be guided efficiently to the components downstream of the second optical system. As a result, the amount of light guided to the components downstream of the second optical system is reduced, which leads to a decrease in illuminance on the exposure surface, for example, in an application as an exposure device.

According to the configuration described above, the adjustment mechanism is provided for adjusting the positional relationship between the light source unit and the first optical system relative to each other. Even when the light source device is installed with a misalignment between each LED element contained in the light source unit and the corresponding collimate lenses (first optical system), the displacement of the focal point formed by the second optical system can be corrected by adjustment through the adjustment mechanism, so that the light is guided efficiently to the components downstream of the second optical system.

The plurality of LED elements may be disposed on a predetermined flat plane, and the adjustment mechanism may be configured to be able to adjust the positional relationship between the light source unit and the first optical system relative to each other in a direction parallel to the predetermined flat plane.

The adjustment mechanism may be configured to enable at least one of the light source unit and the first optical system to rotate within a flat plane parallel to the predetermined flat plane.

A specific embodiment may include an LED board accommodating the light source unit, with the adjustment mechanism attached to the LED board, or may include a lens holder accommodating the first optical system, with the adjustment mechanism attached to the lens holder.

In the configuration described above, an integrator optical system having an incident surface disposed at the focal point of the second optical system may be included.

An LED element produces less radiant flux as compared to a lamp. For use as the light source device for exposure purposes, it is necessary to collect light beams emitted from a plurality of LED elements as much as possible. To achieve this, the number of LED elements disposed as the light source needs to be increased.

LED elements themselves cannot be positioned in full contact with each other because LED elements need the wiring pattern for power supply. That is to say, when a plurality of LED elements is to be arranged, there needs to be certain spacing provided between adjacent LED elements. The region corresponding to this spacing forms a region that does not emit light (non-light-emitting region). Therefore, when a plurality of LED elements is simply arranged and light beams emitted from each LED element are collected, there is inevitably created a non-light-emitting region. Hence, a decrease in brightness on the illuminated surface will occur if the light emitted from the plurality of LED elements is simply collected.

According to the configuration described above, the light emitted from the plurality of LED elements is collected after being collimated in the first optical system. Thus an image can be formed at the focal point by the light beams emitted from each LED element. The distance between the light beams emitted from the LED elements can be made shorter by adjusting the arrangement of the collimate lenses (first optical system) so that the light source is configured to have a smaller non-light-emitting region. Thus a high-brightness light source device is realized.

The integrator optical system may be configured with a light guide member that causes light incident on the incident surface to repeat reflection on an inner side face thereof when guiding the light beam to an emission surface.

According to this configuration, light is collected on the incident surface of the light guide member with a high radiation intensity, so that high-brightness light with a uniform illuminance distribution can be emitted from the emission surface of the light guide member. The light guide member can be configured with a rod integrator, or a light tunnel, for example.

The integrator optical system may be configured with a fly eye lens having a plurality of lenses disposed in a matrix form.

The fly eye lens can make the illuminance distribution on the illuminated surface uniform. Thus a high-brightness light source device with a uniform illuminance distribution can be realized.

Effect of the Invention

According to the present invention, a decrease in brightness or illuminance accompanied by a misalignment in a light source device including a plurality of LED elements can be suppressed even if there is a misalignment present between an optical system and the LED elements.

BRIEF DESCRIPTION OF THE DRAWINGS

FIG. 8 is a schematic view illustrating one configuration example of an exposure device.

MODE FOR CARRYING OUT THE INVENTION

Hereinafter, a light source device of the present invention will be described with reference to the drawings. The dimensional ratio in each view does not necessarily correspond to the actual dimensional ratio.

Figure 1:
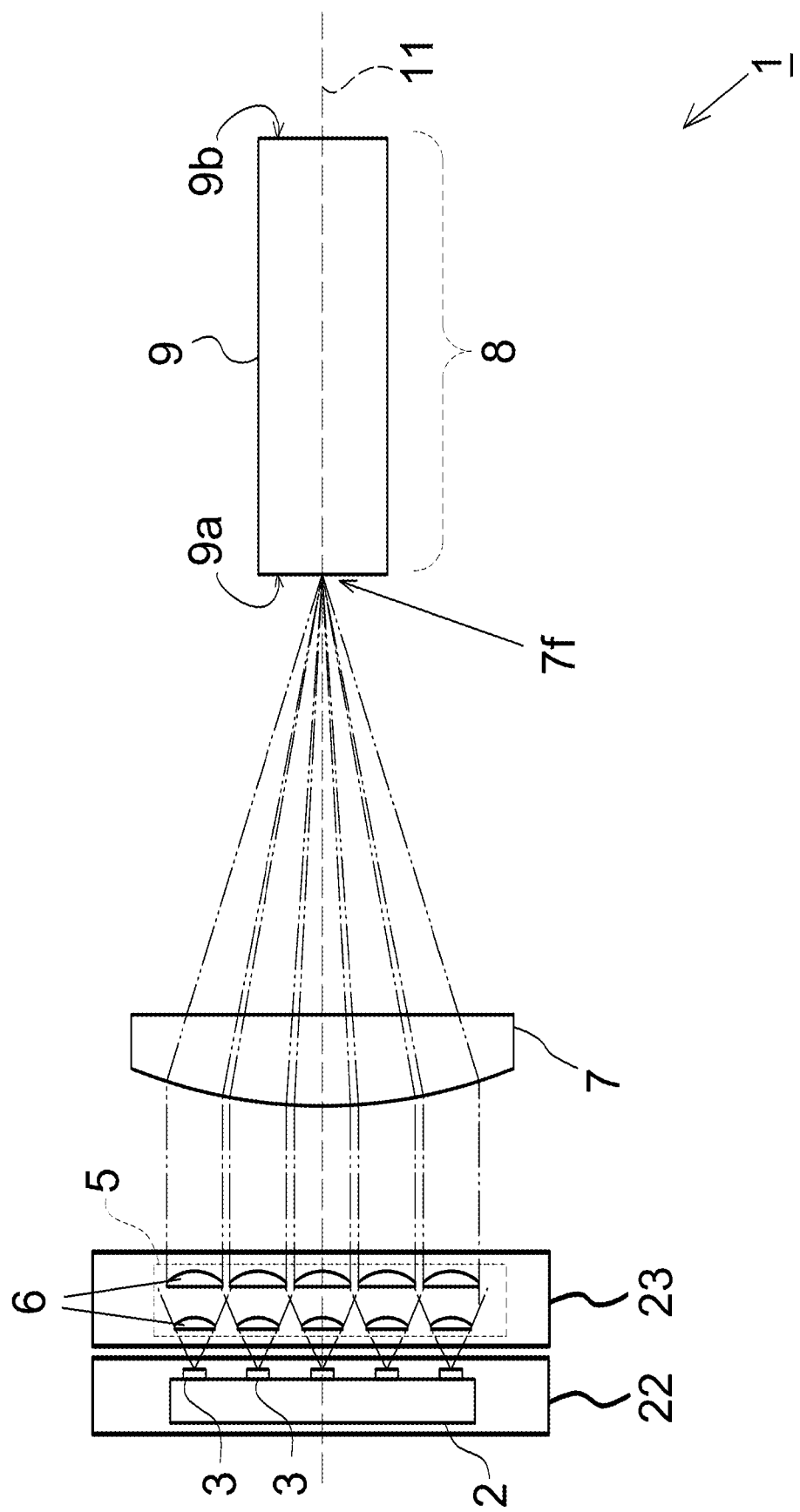
FIG. 1 is a schematic view illustrating one example of an optical system in a light source device.

FIG. 1 is a schematic view illustrating one example of an optical system in a light source device. The light source device 1 includes a light source unit 2, a first optical system 5, a second optical system 7, and an integrator optical system 8. In the light source device 1 of the present embodiment, the light source unit 2 is accommodated in an LED board 22, while the first optical system 5 is accommodated in a lens holder 23. Although not shown in FIG. 1, these LED board 22 and lens holder 23 are configured such that the positional relationship relative to each other can be adjusted. One example of a specific configuration will be described later.

The light source unit 2 includes a plurality of LED elements 3. In the present embodiment, the plurality of LED elements 3 are disposed on a predetermined flat plane, for example. The plurality of LED elements 3 in the present invention may be arranged in any pattern.

The first optical system 5 is an optical system that collimates each of the light emitted from the plurality of LED elements 3 and configured with a plurality of collimate lenses 6 arranged in correspondence with each LED element 3.

The second optical system 7 is an optical system that collects the light emitted from the first optical system 5 to a focal point 7f of the second optical system 7.

In the present embodiment, the integrator optical system 8 is configured with a rod integrator 9. The rod integrator 9 is arranged such that an incident surface 9a thereof is located at the focal point 7f of the second optical system 7. The expression "located at the focal point" used herein shall be a concept that contains not only a complete correspondence with the focal point but also other positions displaced in directions parallel to an optical axis 11 by a distance of ±10% relative to the focal distance. The optical axis 11 in FIG. 1 is an axis orthogonal to the incident surface of the integrator optical system 8, i.e., the incident surface 9a of the rod integrator 9.

The rod integrator 9 is one example of a light guide member (light guide) that has the function of making the illuminance distribution of the light on an emission surface 9b uniform by causing the light incident on the incident surface 9a to repeat total reflection on side faces when guiding the light toward the emission surface 9b. Such a light guide member is configured with a columnar member made of a light transmissive material such as glass or resin, or a hollow member having an inner face formed by a reflection mirror. A light guide having the latter configuration, in particular, is sometimes referred to as a light tunnel. The light guide member may be configured to have a plurality of split optical paths inside along a direction parallel to the optical axis.

Figure 2:
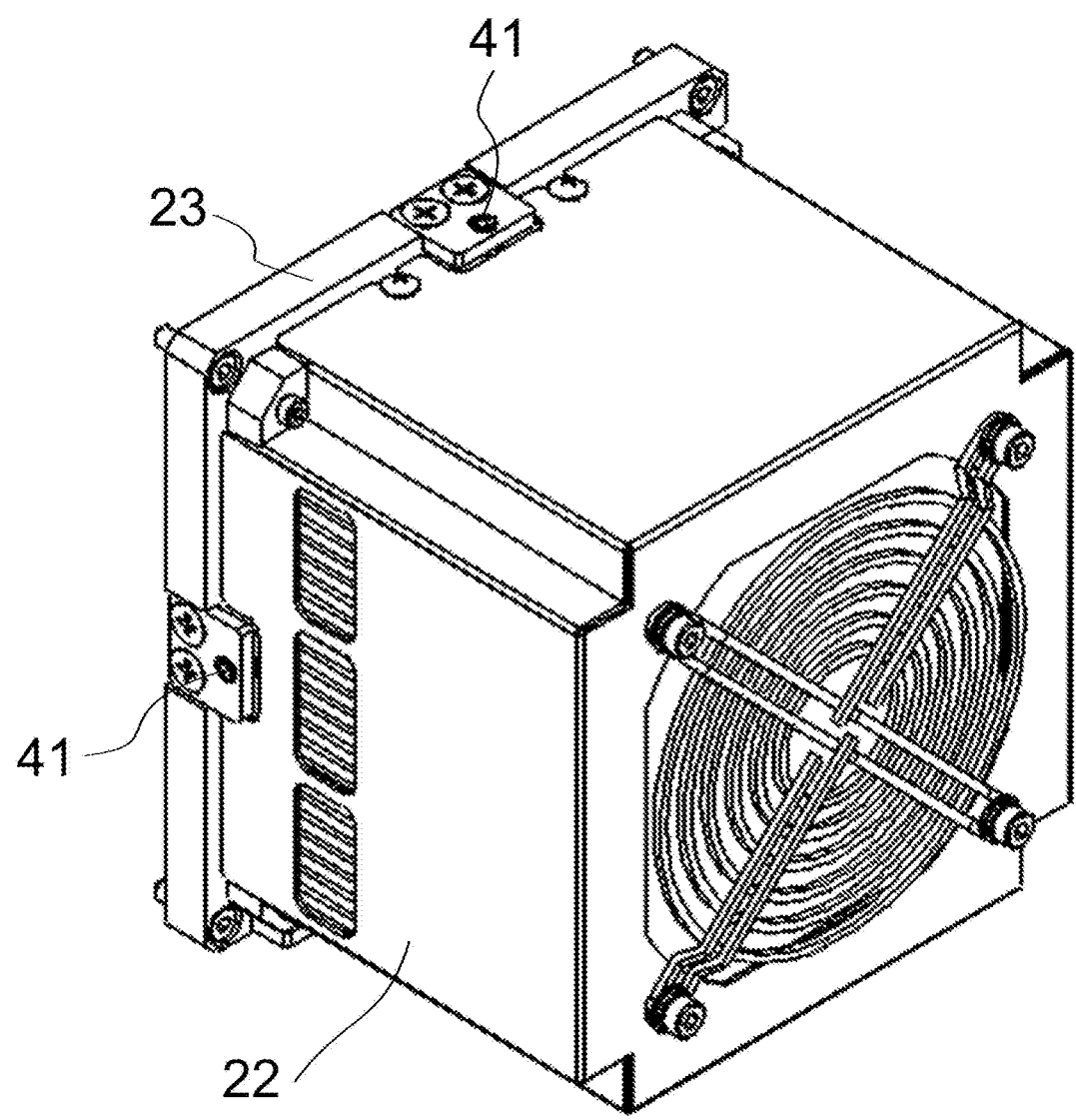
FIG. 2 is a schematic view illustrating one example of the positional relationship between a light source unit and a first optical system.
Figure 3:
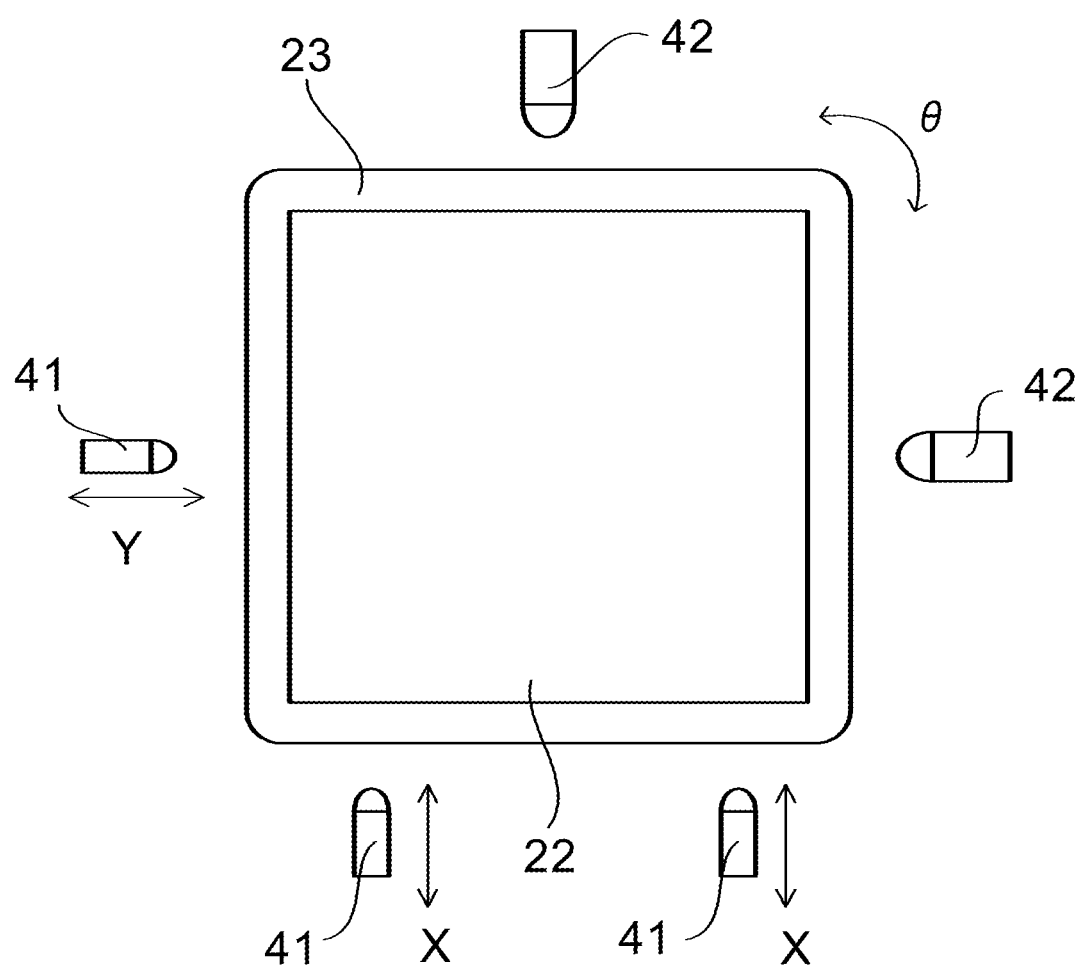
FIG. 3 is a schematic view illustrating one example of the positional relationship between the light source unit and the first optical system.
Figure 4:
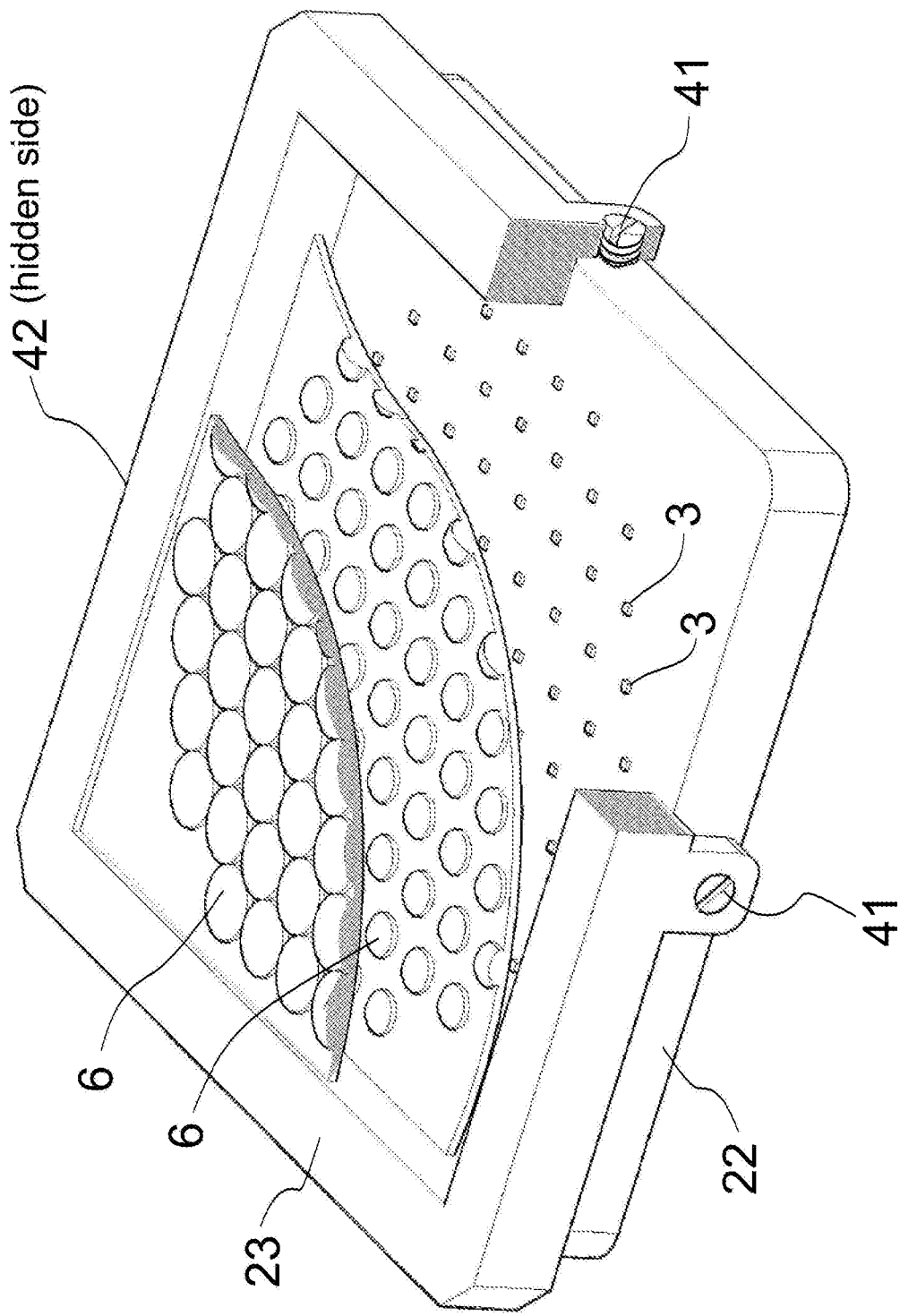
FIG. 4 is a schematic view illustrating one example of the positional relationship between the light source unit and the first optical system.

FIG. 2, FIG. 3, and FIG. 4 are views each illustrating one example of the positional relationship between the light source unit 2 and the first optical system 5. In the example shown in FIG. 2, the LED board 22 accommodating the light source unit 2 and the lens holder 23 accommodating the first optical system 5 are integrally held with screws and the like. FIG. 2 shows clamping screws 41 provided separately from the screws. This clamping screw 41 is one example of an adjustment mechanism.

FIG. 3 is an example of a schematic plan view showing the interior of FIG. 2 viewed from the LED board 22 side. FIG. 4 is a schematic perspective view showing the interior of FIG. 2. In this example, three clamping screws 41 and two ball plungers 42 make up a configuration that enables adjustment of the positional relationship between the LED board 22 and the lens holder 23. For convenience of illustration, FIG. 4 does not show part of the clamping screws 41 and the ball plungers 42.

The ball plunger 42 contains a screw inside. Pushing and pulling the clamping screws 41 at three locations, with the screws between the LED board 22 and the lens holder 23 being slightly loosened, causes rigid balls at the tips of the ball plungers 42 to move. This movement allows for adjustment of the positional relationship between the LED board 22 and the lens holder 23 relative to each other. More specifically, movements in an X direction, movements in a Y direction, and rotational movements in a θ direction, as shown in FIG. 3, are possible. The plurality of LED elements 3 are arranged on a plane (X-Y plane) formed by the X direction and the Y direction mentioned here.

With the plurality of LED elements 3 forming the light source unit 2 illuminated, an image on the incident surface 9a of the rod integrator was measured, while the positional relationship between the LED board 22 and the lens holder 23 relative to each other was adjusted by operating the adjustment mechanism (clamping screws 41 in this example). FIG. 5A to FIG. 5D are schematic views of photographs of the image at respective time points. In each view, reference numeral 61 indicates a reference region, while reference numeral 60 indicates a region emerging as an image. The center position of the image 60 is denoted by a reference numeral 62. Here, the light source unit 2 is configured with eighty-five LED elements 3 arranged within an area of 80 mm square.

For example, one turn of a clamping screw 41 can cause a front-to-back movement by 0.4 mm, and a quarter turn can cause a movement by 0.1 mm. Further, as shown in FIG. 3, relative movement of two clamping screws 41 provided on the same side can cause the lens holder 23 to rotate relative to the LED board 22. For example, provided that the two clamping screws 41 are spaced apart by 60 mm, rotation by 1° of the 80 mm square light source unit 2 can be achieved by a displacement by about 1 mm in the relative positional relationship between these two clamping screws 41 (2 and a half turns). The positional relationship may be changed relatively by advancing or retracting one clamping screw 41 of the two clamping screws 41, or, the positional relationship may be changed relatively by advancing one clamping screw 41 and retracting the other clamping screw 41.

Figure 5A:
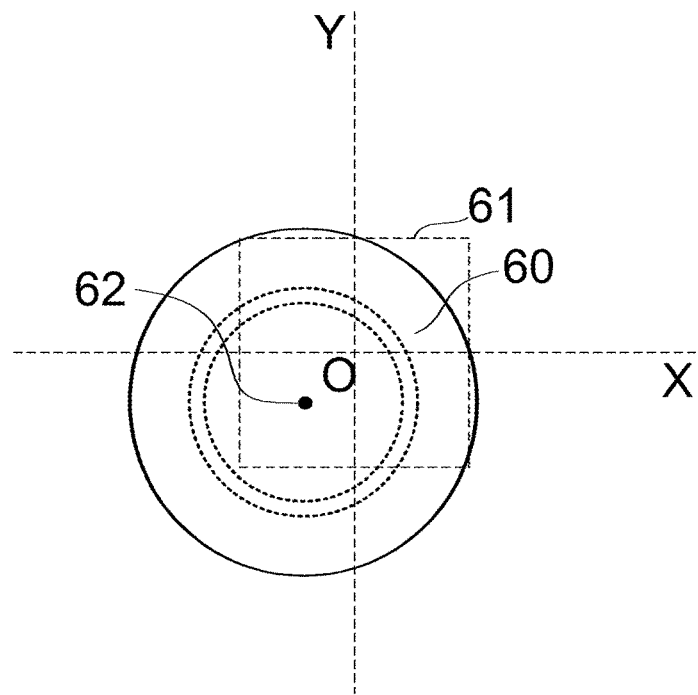
FIG. 5A is a schematic view illustrating an image on an incident surface of a rod integrator before position adjustment.

FIG. 5A corresponds to an initial time point, for example. It can be seen from FIG. 5A that the center 62 of the image is displaced from the center O of the reference region 61. It can also be seen that the image 60 is circular and that the light from each LED element 3 are not necessarily collected at substantially the same point because the image 60 is out of focus. This implies that there is a misalignment present between the light source unit 2 and the first optical system 3.

Figure 5B:
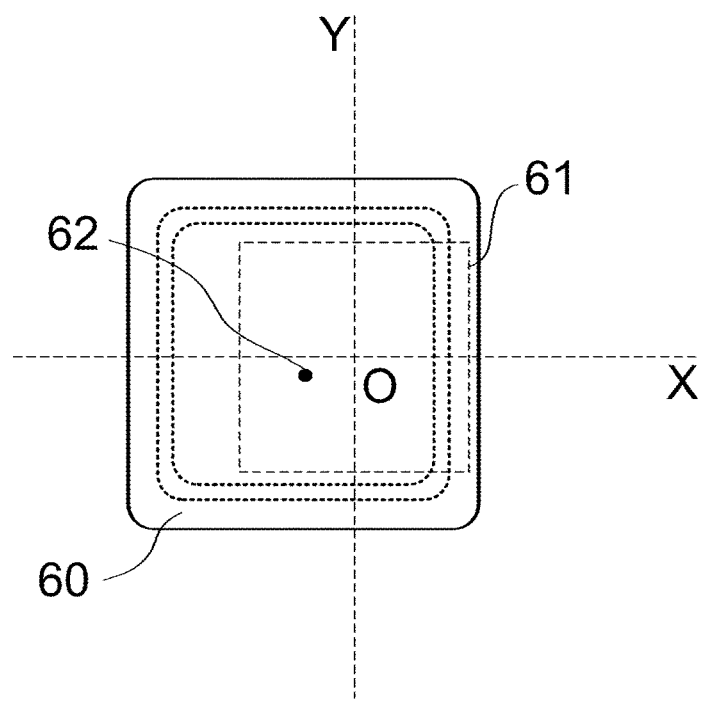
FIG. 5B is a schematic view illustrating an image on the incident surface of the rod integrator after a first step adjustment.

FIG. 5B is a measurement result after the lens holder 23 has been rotated by 1° relative to the LED board 22 by operating the adjustment mechanism from the state of FIG. 5A. The image 60 shown in FIG. 5B forms a quadrate shape corresponding to the light source unit 2, and the image is projected more clearly as compared to the state of FIG. 5A. Therefore it can be seen that the centers of each LED element 3 and the optical axis of the corresponding collimate lens 6 are closer than in the state of FIG. 5A.

Figure 5C:
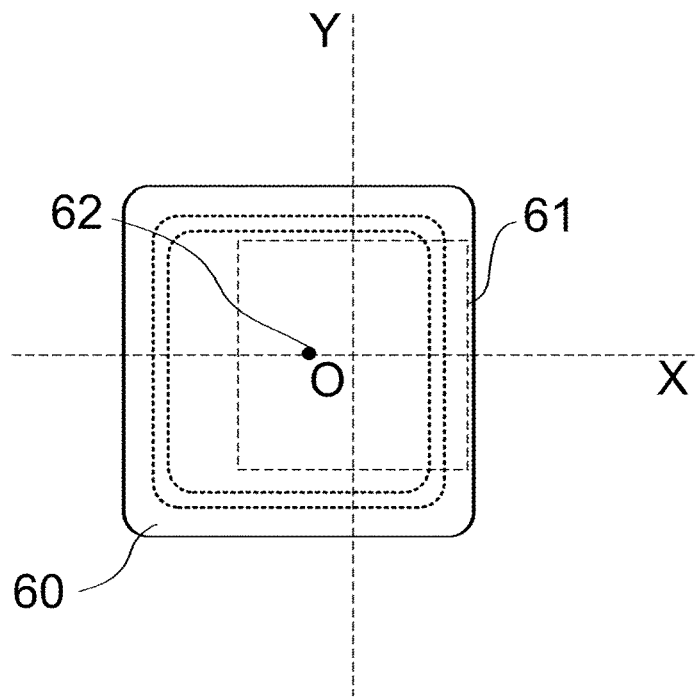
FIG. 5C is a schematic view illustrating an image on the incident surface of the rod integrator after a second step adjustment.
Figure 5D:
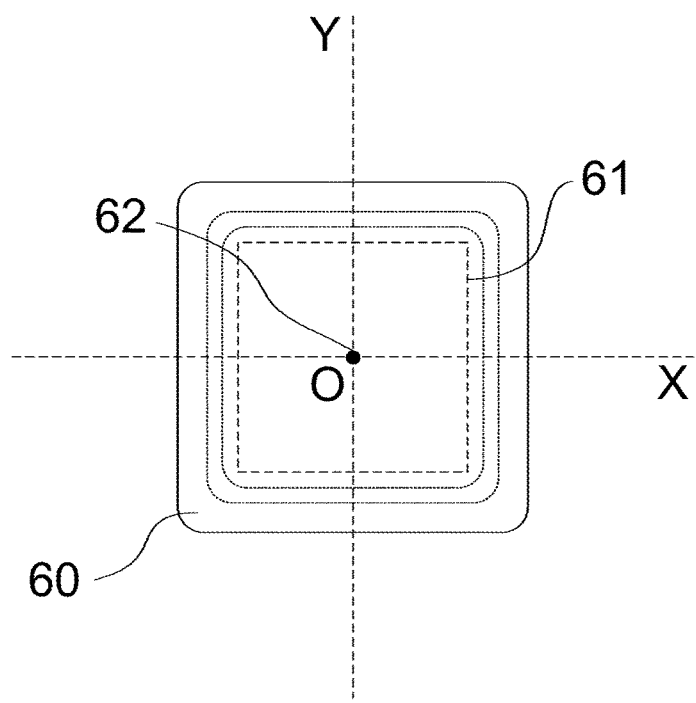
FIG. 5D is a schematic view illustrating an image on the incident surface of the rod integrator after a third step adjustment.

FIG. 5C is a measurement result after the lens holder 23 has been moved in an X direction by 0.2 mm relative to the LED board 22 by further operating the adjustment mechanism from the state of FIG. 5B. FIG. 5D is a measurement result after the lens holder 23 has been moved in a Y direction by 0.2 mm relative to the LED board 22 by further operating the adjustment mechanism from the state of FIG. 5C. As compared to the state of FIG. 5B, the center 62 position of the image 60 is closer to the center O of the reference region 61 in the state of FIG. 5C. The center 62 of this image 60 is even closer to the center O of the reference region 61 in the state of FIG. 5D.

Operating the adjustment mechanism this way enables the light emitted from the plurality of LED elements 3 to be collected to substantially one point, as well as enables adjustment of the position of the focal point. The light can be guided onto the light emission surface 9b of the rod integrator 9 with high illuminance by moving the focal point to a central area of the light incident surface 9a of the rod integrator 9.

Figure 6A:
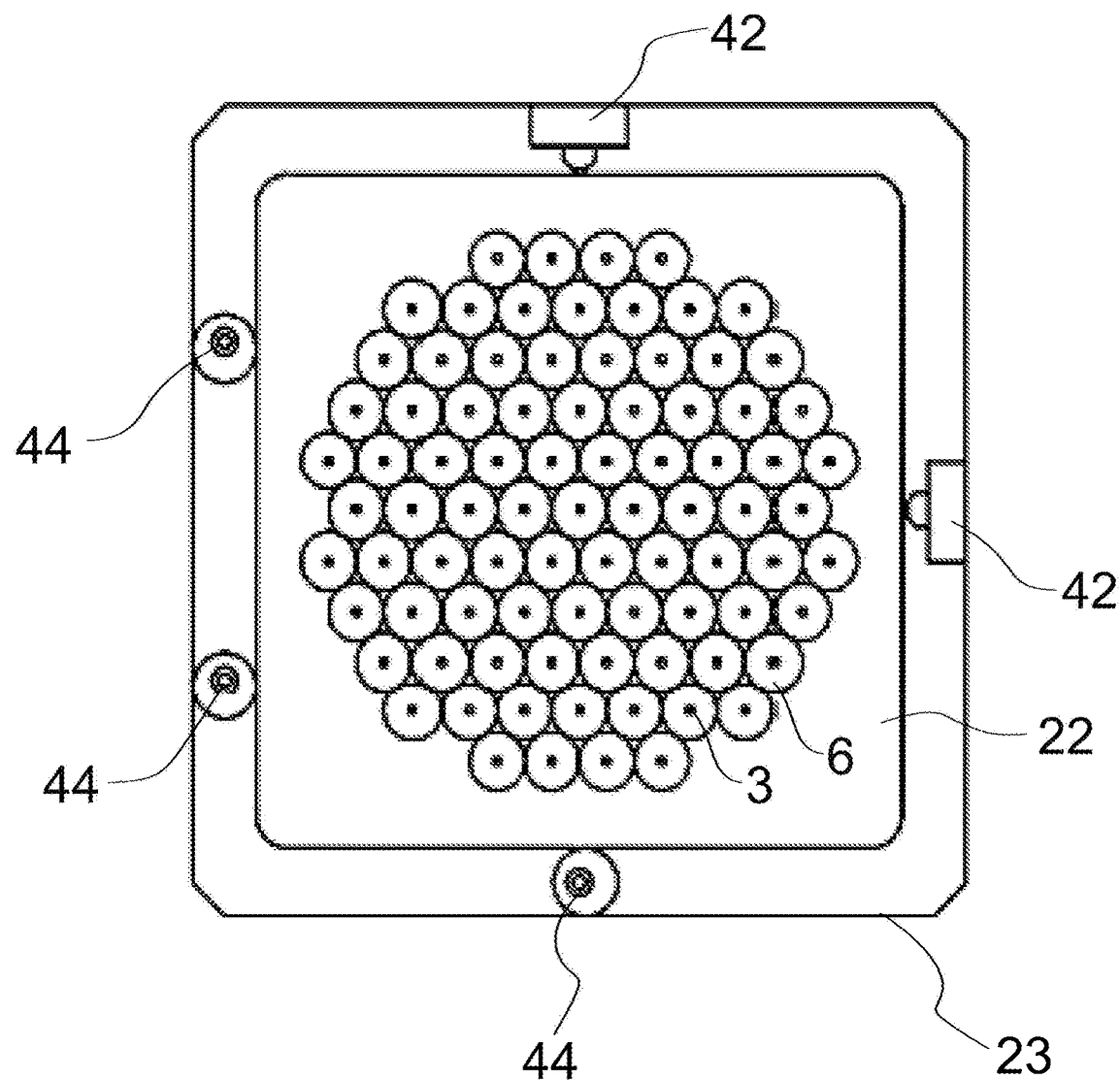
FIG. 6A is a schematic view illustrating one example of the positional relationship between the light source unit and the first optical system.
Figure 6B:
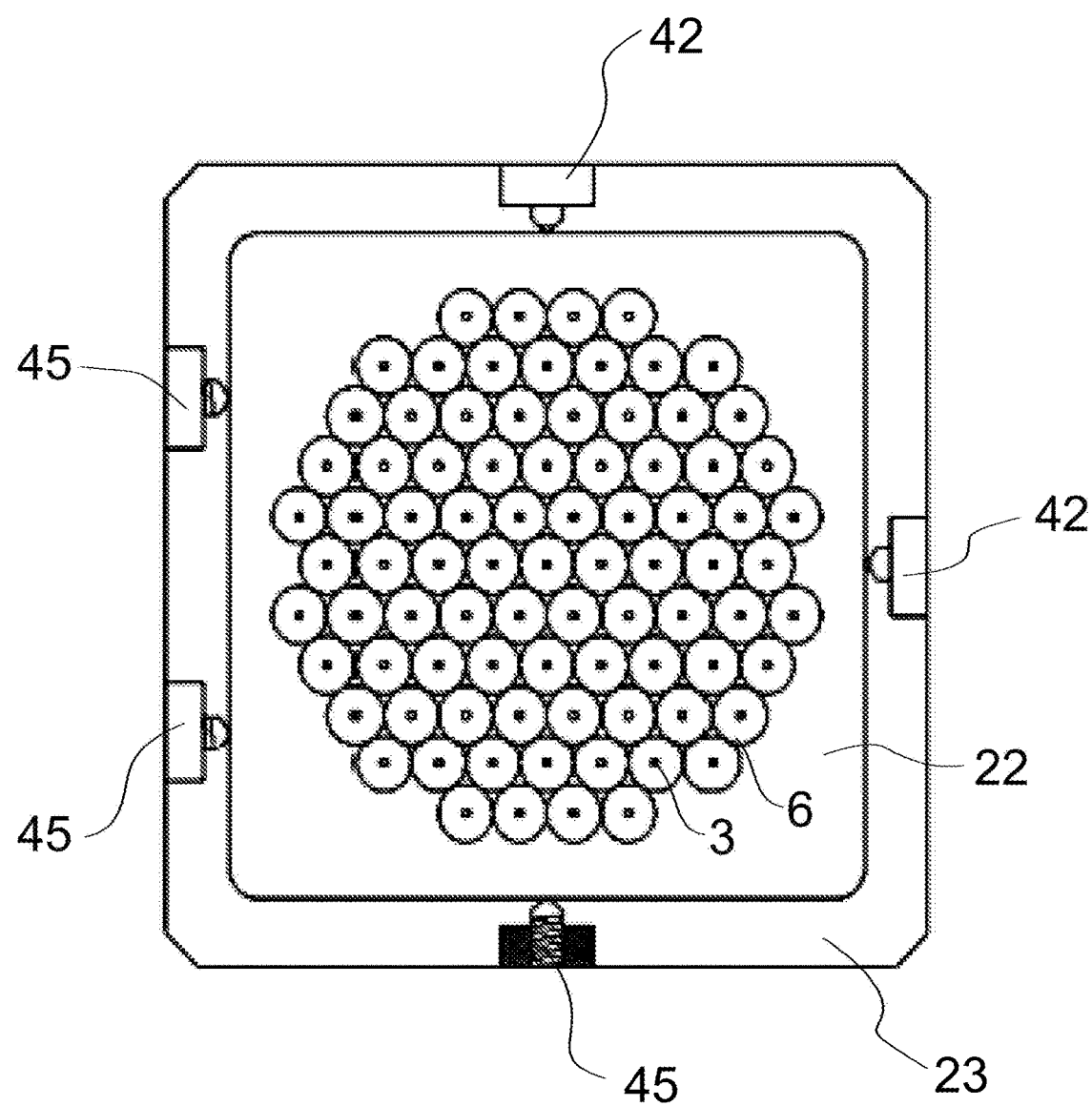
FIG. 6B is a schematic view illustrating one example of the positional relationship between the light source unit and the first optical system.

While clamping screws 41 are used as the adjustment mechanism in the present embodiment, the adjustment mechanism is not limited to this configuration. Cams 44 may be used, for example, as shown in FIG. 6A, or pins 45 may be used as shown in FIG. 6B. In the configuration of FIG. 6A, the rotation axes of the cams 44 may be attached either to the lens holder 23 or the LED board 22. In the configuration of FIG. 6B, the base parts of the pins 45 may be attached either to the lens holder 23 or the LED board 22.

Other Embodiments

Other embodiments will be described below.

Figure 7:
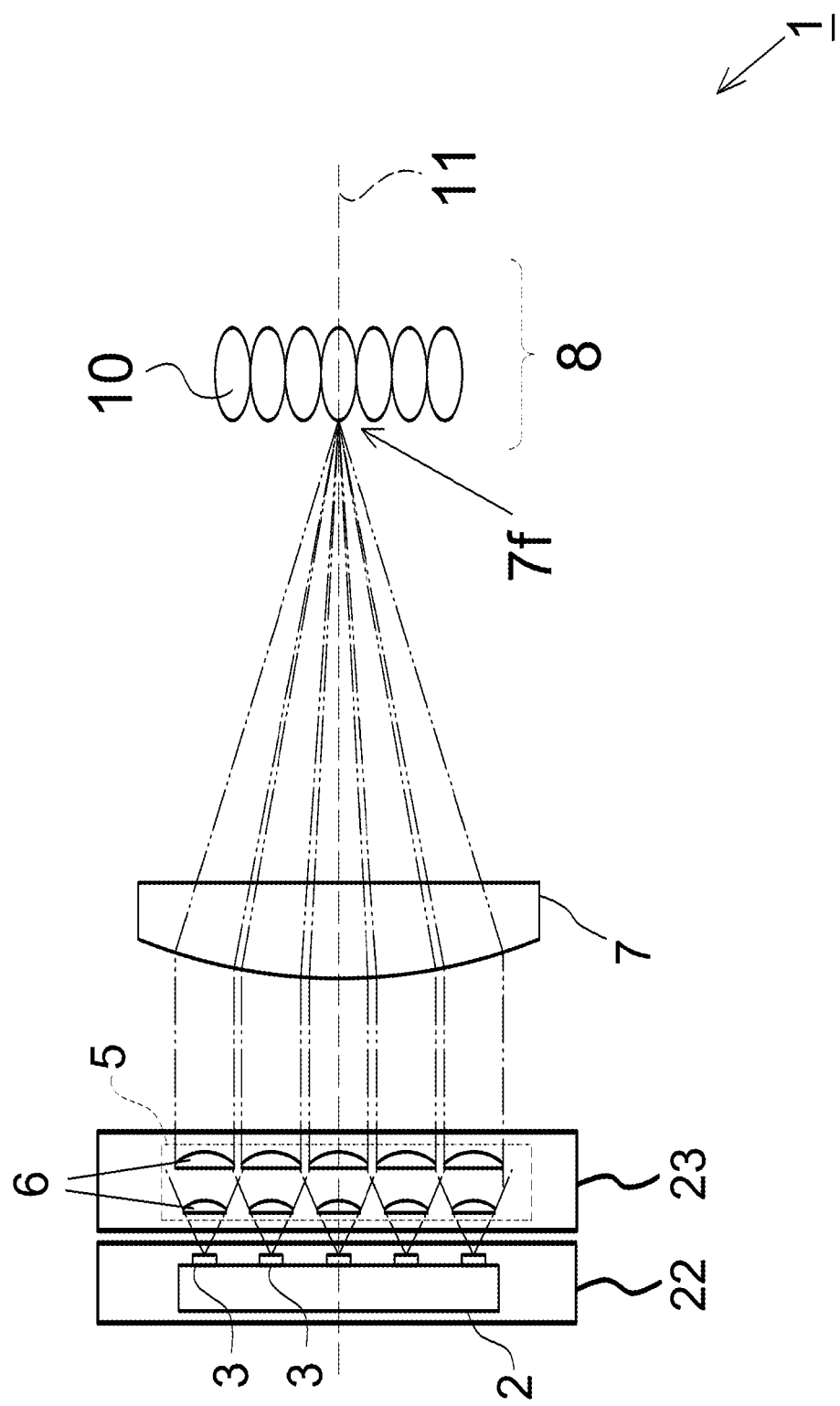
FIG. 7 is a schematic view illustrating one example of an optical system in the light source device.

<1> As shown in FIG. 7, the integrator optical system 8 may be configured with a fly eye lens 10. In this case, high-brightness light is collected on the incident surface of the fly eye lens 10, and high-brightness light is emitted from the fly eye lens 10. The integrator optical system 8 in other configurations described in the foregoing can also be configured with the fly eye lens 10.

<2> The light source device 1 described above can be used as the light source of an exposure device or a projector. FIG. 8 is a schematic view illustrating the configuration of an exposure device including the light source device 1.

The exposure device 19 includes a projection optical system 15 and a mask 16 downstream of the integrator optical system 8, and may include a projection lens 17 depending on the need. The mask 16 is placed at a location where the projection optical system 15 projects light, and a photosensitive substrate 18, on which a pattern image of the mask 16 is to be developed, is set downstream of the mask 16. In this state, when light is emitted from the light source unit 2, this light is collected by the second optical system 7, after which the illuminance distribution of the light is made uniform by the rod integrator 9, the light is projected to the projection optical system 15. The projection optical system 15 projects this light in the form of the pattern image of the mask 16 directly or through the projection lens 17 on the photosensitive substrate 18.

In the case the light source device 1 is used for the exposure device 19, UV-light emitting elements are often used as the LED elements 3. When the light emitted from the LED elements 3 is UV light, the image cannot be visually perceived. In such a case, the adjustment mechanism (such as the clamping screw 41 and the like) may be operated to adjust the positional relationship between the LED board 22 and the lens holder 23 relative to each other with a plate coated with a fluorescent substance disposed on the light incident surface of the integrator optical system 8 (light incident surface 9a of the rod integrator 9) to make the image visible with the fluorescent substance exited by the UV light.

<3> In the embodiments described above, the lens holder 23 is configured to be movable in the X direction, the Y direction, and in rotational directions on the X-Y plane relative to the LED board 22. The lens holder may be configured to be movable in at least one of these directions, and may be configured to be movable in yet another directions (e.g., directions orthogonal to the X-Y plane). Alternatively, the LED board 22 may be configured movable relative to the lens holder 23.

<4> In the embodiments described above, the light source device 1 may include an additional optical system as required such as a reflective optical system for the purpose of altering the optical path.

DESCRIPTION OF REFERENCE SIGNS

1: light source device
2: light source unit
3: LED element
5: first optical system
6: collimate lens
7: second optical system
7f: focal point of the second optical system
8: integrator optical system
9: rod integrator
9a: incident surface of the rod integrator
9b: emission surface of the rod integrator
10: fly eye lens
11: optical axis
15: projection optical system
16: mask
17: projection lens
18: photosensitive substrate
19: exposure device
22: LED board
23: lens holder
41: clamping screw
42: ball plunger
44: cam
45: pin
60: image
61: reference region
62: center position of the image

The invention claimed is:

1. A light source device comprising:
a light source unit having a plurality of LED elements disposed on a predetermined flat plane;
a first optical system having a plurality of collimate lenses arranged in correspondence with each LED element that collimates each of light emitted from the light source unit;
a second optical system that collects a plurality of light emitted from the first optical system;
an LED board accommodating the light source unit;
a lens holder accommodating the first optical system being fixed in an optical axis direction relative to the LED board;
an adjustment mechanism being attached to at least one of the LED board and the lens holder adjusting a positional relationship between the LED board and the lens holder relative to each other in a direction parallel to the predetermined flat plane while maintaining a fixing state of the LED board and the lens holder in the optical axis direction; and wherein the adjusting mechanism is configured with a total of three or more pushing and pulling members arranged on two orthogonal sides among four sides forming a quadrate shape when viewed from the optical axis direction.

2. The light source device according to claim 1, wherein the adjustment mechanism is configured to enable at least one of the light source unit and the first optical system to rotate within a flat plane parallel to the predetermined flat plane.

3. The light source device according to claim 1, wherein the adjustment mechanism is attached to the LED board.

4. The light source device according to claim 1, wherein the adjustment mechanism is attached to the lens holder.

5. The light source device according to claim 1, further comprising an integrator optical system having an incident surface disposed at a focal point of the second optical system.

6. The light source device according to claim 1, comprising a plunger arranged on a side facing the quadrate side on which one of the pushing and pulling members is arranged when viewed from the optical axis direction.

7. The light source device according to claim 2, further comprising an integrator optical system having an incident surface disposed at a focal point of the second optical system.

8. The light source device according to claim 3, further comprising an integrator optical system having an incident surface disposed at a focal point of the second optical system.

9. The light source device according to claim 4, further comprising an integrator optical system having an incident surface disposed at a focal point of the second optical system.

10. The light source device according to claim 5, wherein the integrator optical system is configured with a light guide member that causes light incident on the incident surface to repeat reflection on an inner side face thereof when guiding the light beam to an emission surface.

11. The light source device according to claim 5, wherein the integrator optical system is configured with a fly eye lens having a plurality of lenses disposed in a matrix form.

12. The light source device according to claim 6, wherein
the plunger is a ball plunger,
the one of the pushing and pulling members is a clamping screw,
the single ball plunger and the single clamping screw are positioned so as to face each other when viewed from the optical axis direction.

13. The light source device according to claim 6, wherein
the plunger is a ball plunger,
the one of the pushing and pulling members is a clamping screw,
the single ball plunger is arranged on a side forming the quadrate shape, and the plurality of clamping screws are arranged on a side facing the side when viewed from the optical axis direction.

* * * * *